US010062311B2

(12) United States Patent
Hsin et al.

(10) Patent No.: US 10,062,311 B2
(45) Date of Patent: Aug. 28, 2018

(54) DISPLAY SUBSTRATE AND FABRICATING METHOD THEREOF, AND DISPLAY DEVICE

(71) Applicant: BOE TECHNOLOGY GROUP CO., LTD., Beijing (CN)

(72) Inventors: Lung Pao Hsin, Beijing (CN); Junjie Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 48 days.

(21) Appl. No.: 15/113,340

(22) PCT Filed: Jan. 19, 2016

(86) PCT No.: PCT/CN2016/071333
§ 371 (c)(1),
(2) Date: Jul. 21, 2016

(87) PCT Pub. No.: WO2017/012316
PCT Pub. Date: Jan. 26, 2017

(65) Prior Publication Data
US 2017/0148366 A1 May 25, 2017

(30) Foreign Application Priority Data

Jul. 23, 2015 (CN) .......................... 2015 1 0437925

(51) Int. Cl.
*G09G 5/02* (2006.01)
*G09G 3/20* (2006.01)
(Continued)

(52) U.S. Cl.
CPC ......... *G09G 3/2003* (2013.01); *G09G 3/3225* (2013.01); *H01L 27/3213* (2013.01);
(Continued)

(58) Field of Classification Search
CPC .............. G09G 3/2003; G09G 3/3225; G09G 2300/0443; G09G 2300/0809;
(Continued)

(56) References Cited

U.S. PATENT DOCUMENTS

2005/0225574 A1* 10/2005 Brown Elliott ... G02F 1/133514
345/694
2012/0126252 A1* 5/2012 Hermes ............... H01L 51/5265
257/79

FOREIGN PATENT DOCUMENTS

CN 2906675 Y 5/2007
CN 101118335 A 2/2008
(Continued)

OTHER PUBLICATIONS

Office Action from corresponding Chinese Application No. 201510437925.7, dated Jun. 20, 2017 (7 pages).

*Primary Examiner* — Mark Edwards
(74) *Attorney, Agent, or Firm* — Harness, Dickey & Pierce, P.L.C.

(57) ABSTRACT

Embodiments of the present invention relate to a display substrate and fabricating method thereof and a display device. The display substrate comprises a plurality of pixel groups, wherein each of said pixel groups comprises a plurality of color sub-pixels and a plurality of white sub-pixels. A first driving transistor is provided in a light emitting layer missing region of the color sub-pixel, for driving the color sub-pixel. A second driving transistor and a white sub-pixel are provided on the first driving transistor, the second driving transistor for driving the white sub-pixel. According to the technical solution, white light OLED display may be implemented by forming the white sub-pixel and the driving transistor thereof on the driving transistor of the color sub-pixel, while making use of the space on the
(Continued)

thickness dimension of the color sub-pixel, so that the light emitting layer missing region in the color sub-pixel is fully utilized.

16 Claims, 6 Drawing Sheets

(51) Int. Cl.
 *G09G 3/3225* (2016.01)
 *H01L 27/32* (2006.01)
 *H01L 51/56* (2006.01)
(52) U.S. Cl.
 CPC ...... *H01L 27/3246* (2013.01); *H01L 27/3262* (2013.01); *H01L 51/56* (2013.01); *G09G 2300/0443* (2013.01); *G09G 2300/0809* (2013.01)
(58) Field of Classification Search
 CPC ............. H01L 27/3213; H01L 27/3246; H01L 27/3262; H01L 51/56
 See application file for complete search history.

(56) References Cited

FOREIGN PATENT DOCUMENTS

| | | |
|---|---|---|
| CN | 103489894 A | 1/2014 |
| CN | 104716167 A | 6/2015 |
| CN | 104966728 A | 10/2015 |
| WO | WO2016165278 A1 * | 10/2016 |

* cited by examiner

DISPLAY SUBSTRATE AND FABRICATING METHOD THEREOF, AND DISPLAY DEVICE

CROSS-REFERENCES TO RELATED APPLICATIONS

This application claims priority of Chinese Patent Application No. 201510437925.7, filed on Jul. 23, 2015, the entire content of which is incorporated by reference herein.

FIELD OF THE INVENTION

Embodiments of the present invention relate to the field of display technologies, and specifically, to a display substrate and fabricating method thereof, and a display device.

BACKGROUND

Compared to conventional LCD panels, AMOLED (Active-matrix organic light emitting diode) display screens have characteristics, like fast response, higher contrast and wider view. Because of current driving characteristics of an OLED (Organic Light Emitting Diode), a pixel circuit has a plurality of TFT (Thin Film Transistor) and a plurality of capacitors thereon, for example, a circuit structure as shown in FIG. 1, and a schematic diagram of a corresponding pixel arrangement as shown in FIG. 2.

Currently, due to the increasing requirements for display performance, those skilled in the art have made various improvement attempts to enhance the display performance with respect to the design of the pixel circuit. For example, as shown in FIG. 3, in order to improve the risk of short circuit caused by metal profile in a via hole resulting from the anode and cathode in OLED connected though the via hole, a pixel defining layer is usually employed to fill the via hole for connecting the cathode to the anode, as shown in FIG. 4, however, this may cause a reduced aperture ratio. It is noted that, in practice, the cathode and anode in FIG. 3 and FIG. 4 further comprise therebetween other layers not shown in the drawings, such as a light emitting layer and the like.

In another example, to further improve the display performance, the number of pixels in unit area can be increased, but this may lead to a problem of small capacitance. The capacitance may be increased in the art by providing an additional Metal3 (a metal which does not belong to a gate metal layer or source-drain metal layer) in a display substrate. For example, by adding a Metal3 as shown in FIG. 6 on the basis of the structure of the display substrate shown in FIG. 5 can increase the capacitance. However, still there will be a problem of lower aperture ratio.

In summary, in order to compensate for the shortcomings of the pixel structure, it would inevitably lead to a decrease in the aperture ratio of the display panel, as well as to white light OLED (WOLED).

BRIEF SUMMARY OF THE DISCLOSURE

Embodiments of the present invention provide a display substrate and fabricating method thereof, and a display device, which can effectively utilize light emitting layer missing regions in pixels in a case where the light emitting layer missing regions in the pixels of a display panel inevitably lose aperture area.

According to a first aspect of the present invention, there is provided a display substrate comprising a plurality of pixel groups, wherein each of said pixel groups comprises a plurality of color sub-pixels and a plurality of white sub-pixels, each color sub-pixel corresponding to one white sub-pixel, each color sub-pixel comprises a light emitting region and a light emitting layer missing region, a first driving transistor is provided in the light emitting layer missing region, for driving the color sub-pixel, a second driving transistor and a white sub-pixel corresponding to the color sub-pixel are provided on the first driving transistor, the second driving transistor for driving the white sub-pixel.

In one embodiment, the thickness of the first driving transistor is equal to the thickness of the micro-cavity of the white sub-pixel.

In one embodiment, each of the pixel groups comprises four color sub-pixels and four white sub-pixels.

In one embodiment, the four color sub-pixels in the pixel group are arranged in a 2×2 matrix, the light-emitting layer missing region of each color sub-pixel is located on one corner of the color sub-pixel, and the light emitting layer missing regions of different color sub-pixels in the same pixel group are located on corners in different directions of the different color sub-pixels.

In one embodiment, the color sub-pixels and the white sub-pixels are driven by a sub-pixel rendering method.

In one embodiment, in each of the pixel groups, two color sub-pixels located on one diagonal of the 2×2 matrix are green sub-pixels, and two color sub-pixels located on the other diagonal are blue sub-pixel and red sub-pixel respectively.

In one embodiment, the display substrate further comprises a planar layer provided on the first driving transistor, and the sum of the thickness of the first driving transistor and the thickness of the planar layer is equal to the thickness of the micro-cavity of the white sub-pixel.

In one embodiment, the second driving transistor comprises:
a gate provided on the planar layer;
a gate insulating layer provided on the gate;
an active layer provided on the gate insulating layer;
a source and a drain provided on the active layer.

In one embodiment, a passivation layer is further provided on the source and on the drain, an anode of the white sub-pixel is provided on the passivation layer, the anode of the white sub-pixel being electrically connected to the drain through a via hole in the passivation layer, and a pixel defining layer is provided on the anode of the white sub-pixel.

In one embodiment, the display substrate further comprises an anode of the color sub-pixel provided in the light emitting region, wherein the gate of the second driving transistor and the anode of the color sub-pixel are formed in the same layer.

In one embodiment, the display substrate further comprises:
a color organic light emitting layer provided on the anode of the color sub-pixel of the light-emitting region;
a cathode of the color sub-pixel provided on the color organic light emitting layer.

In one embodiment, the cathode of the color sub-pixel and the anode of the white sub-pixel are formed in the same layer.

According to a second aspect of the embodiment of the present invention, there is provided a display device comprising any of the foregoing display substrate.

According to a third aspect of the embodiment of the present invention, there is also provided a fabricating method of a display substrate, comprising:

forming a plurality of pixel groups, wherein each of said pixel groups comprises a plurality of color sub-pixels and a plurality of white sub-pixels, each color sub-pixel corresponding to one white sub-pixel, each color sub-pixel comprises a light emitting region and a light emitting layer missing region, and a first driving transistor is provided in the light emitting layer missing region, for driving the color sub-pixel, forming a second driving transistor on the first driving transistor of the color sub-pixel;

forming a white sub-pixel corresponding to the color sub-pixel on the second driving transistor, wherein the second driving transistor is used for driving the white sub-pixel.

In one embodiment, the thickness of the first driving transistor is equal to the thickness of the micro-cavity of the white sub-pixel.

In one embodiment, each of the pixel groups comprises four color sub-pixels and four white sub-pixels, and the forming the pixel groups comprises:

forming the four color sub-pixels in each of the pixel groups in a 2×2 matrix arrangement;

forming the light-emitting layer missing region of each of the color sub-pixels on one corner of the color sub-pixel, wherein the light emitting layer missing regions of different color sub-pixels in the same pixel group are located on corners in different directions of the different color sub-pixels.

In one embodiment, before the forming the second driving transistor, the method further comprises:

forming a planar layer on the first driving transistor, the sum of the thickness of the first driving transistor and the thickness of the planar layer being equal to the thickness of the micro-cavity of the white sub-pixel.

In one embodiment, the forming the second driving transistor comprises:

forming a gate on the planar layer;
forming a gate insulating layer on the gate;
forming an active layer on the gate insulating layer;
forming a source and a drain on the active layer.

In one embodiment, the fabricating method of the display substrate further comprises:

forming a passivation layer on the source and on the drain
forming a via hole in the passivation layer;
forming an anode of the white sub-pixel on the passivation layer, such that the anode of the white sub-pixel is electrically connected to the drain though the via hole;

forming a pixel defining layer on the anode of the white sub-pixel.

In one embodiment, the fabricating method of the display substrate further comprises forming an anode of the color sub-pixel in the light emitting region, wherein the anode of the color sub-pixel is formed when the gate of the second driving transistor is formed.

In one embodiment, the fabricating method of the display substrate further comprises:

forming a color organic light emitting layer on the anode of the color sub-pixel;

forming a cathode of the color sub-pixel on the color organic light emitting layer.

In one embodiment, the cathode of the color sub-pixel is formed when the anode of the white sub-pixel is formed.

According to the technical solution of the embodiment of the present invention, through forming a white sub-pixel and a driving transistor (i.e., a second driving transistor) of the white sub-pixel on a driving transistor (i.e., a first driving transistor) of a color sub-pixel, white light OLED (i.e., WOLED) display may be implemented, while making full use of the space on the thickness dimension of the color sub-pixel, without occupying the space on the planar dimension of a display panel, whereby a light emitting layer missing region in the color sub-pixel is fully utilized.

BRIEF DESCRIPTION OF THE DRAWINGS

Features and advantages of the present invention will be more clearly understood by reference to the drawings, while the drawings are schematic and should not be construed as any limitation to the present invention, in which.

DETAILED DESCRIPTION

To more clearly understand the above objects, features and advantages of the present invention, the present invention will be further described in detail in combination with the accompanying drawings and specific embodiments. It should be noted that, in the case of no conflict, the embodiments of the present application and features in the embodiments may be combined with each other.

Many specific details are described in the following description for full understanding of the present invention. However, the present invention can also be implemented in other ways different from what is described herein, whereby the protection scope of the present invention is not limited by specific embodiments disclosed below.

Figure 1:
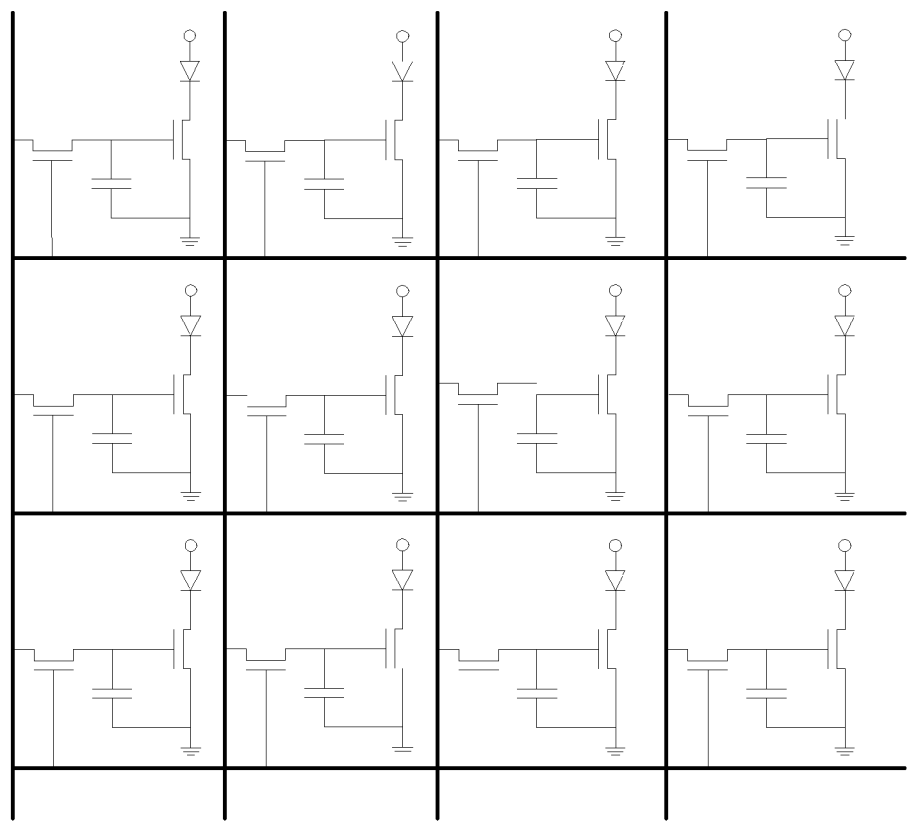
FIG. 1 and FIG. 2 show schematic diagrams of a pixel circuit and a pixel array in the prior art.
Figure 2:
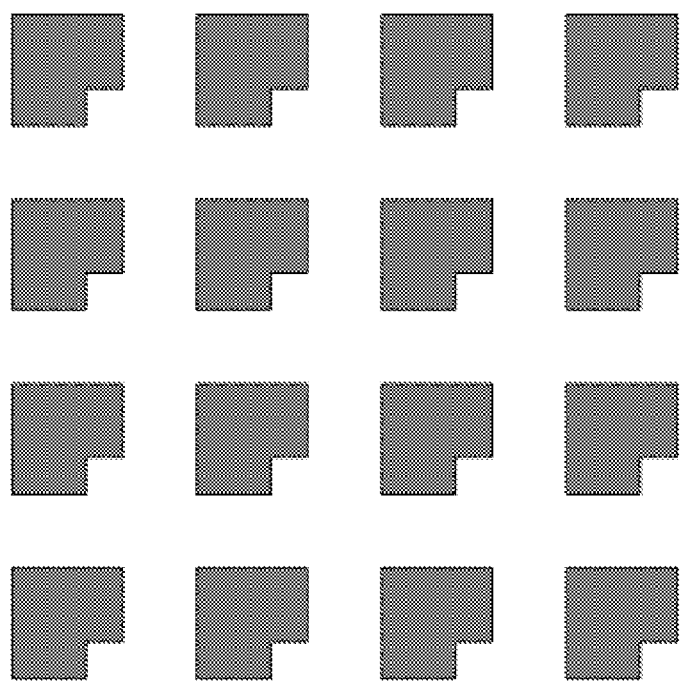
Figure 3:
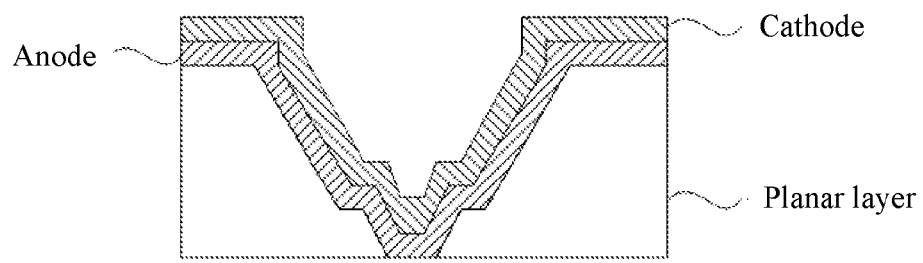
FIGS. 3 to 6 show schematic diagrams of partial cross-sectional views of several pixel structures in the prior art.
Figure 4:
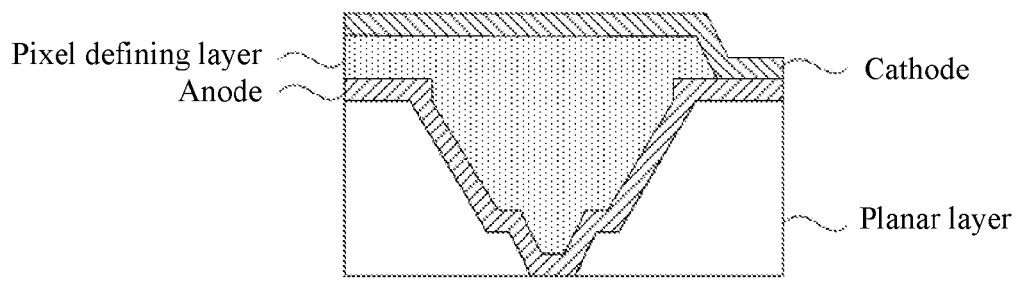
Figure 5:
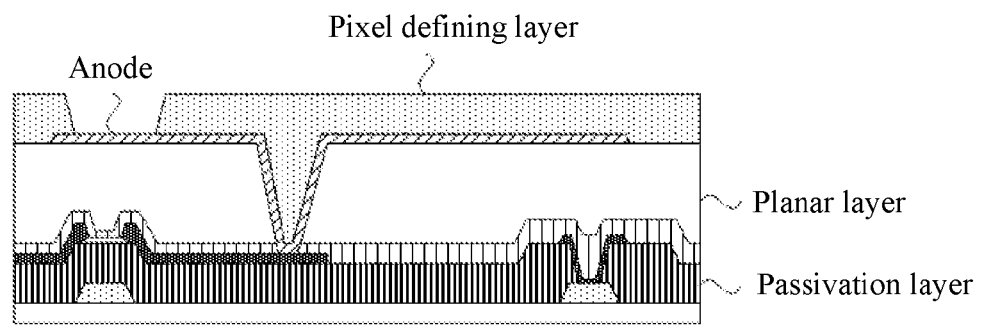
Figure 6:
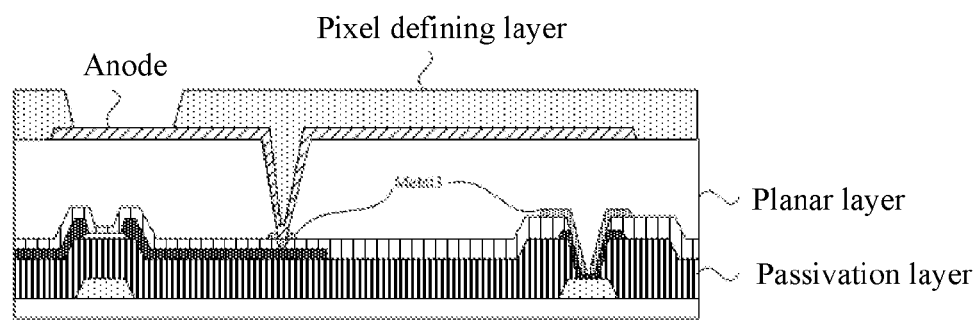
Figure 7:
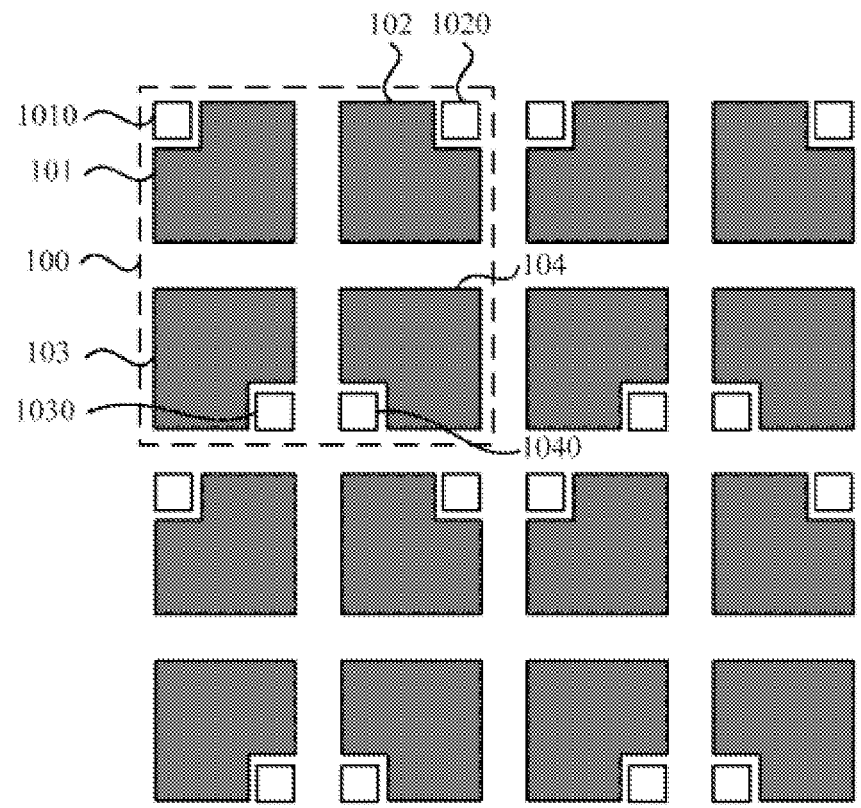
FIG. 7 shows a schematic top view of structure of a display substrate according to one embodiment of the present invention.
Figure 8:
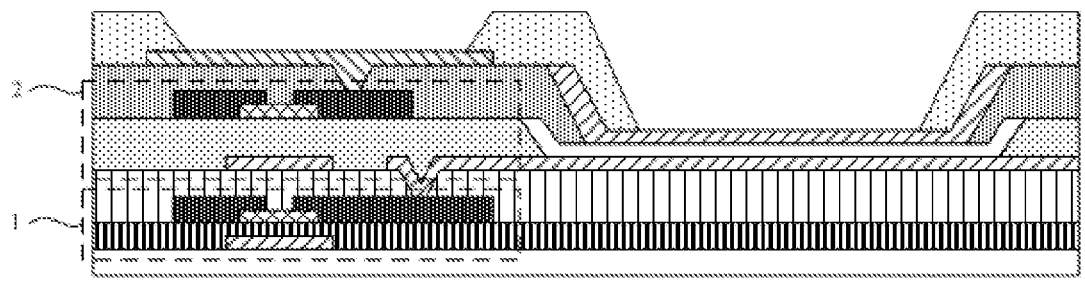
FIG. 8 shows a schematic diagram of a partial cross-sectional view of a display substrate according to one embodiment of the invention.

As shown in FIGS. 7 and 8, a display substrate according to one embodiment of the present invention comprises a plurality of pixel groups, wherein each pixel group 100 comprises four color sub-pixels (101,102,103,104) and four white sub-pixels (1010, 1020, 1030, 1040), each color sub-pixel corresponds to one white sub-pixel, each color sub-pixel comprises a light emitting region and a light emitting layer missing region. As shown in FIG. 8, a first driving transistor 1 is provided in the light emitting layer missing region, for driving the color sub-pixel, and a second driving transistor 2 and a white sub-pixel corresponding to the color sub-pixel are provided on the first driving transistor 1, the second driving transistor 2 for driving the white sub-pixel as shown in FIG. 8.

Those skilled in the art may appreciate that the number of color sub-pixels and the number of white sub-pixels in each pixel group are not limited to 4, and may be other numbers. For the sake of convenience, the above description of the embodiments of the present invention and the following further detailed description of the embodiments of the present invention are given taking that each pixel group comprises four color sub-pixels and four white sub-pixels as an example.

In one embodiment of the present invention, the thickness of the first driving transistor 1 may be equal to the thickness of a micro-cavity of the white sub-pixel, so that the first driving transistor 1 is used as the micro-cavity of the white sub-pixel.

It should be noted that, in the embodiment of the present invention, the light emitting region of the color sub-pixel is a region in which the light-emitting layer is located and in which light with a color corresponding to the sub-pixel in this region may be emitted, and in some embodiments, the light emitting region is also called an aperture region; the light emitting layer missing region of the color sub-pixel is e.g., a region in which the first driving transistor 1 for driving the color sub-pixel and/or other leads or electronic components are located and which is usually not luminous. However, according to the embodiment of the present invention, providing the white sub-pixel and the second driving transistor for driving the white sub-pixel above the light emitting layer missing region enables the light emitting layer missing region to be fully utilized, thereby improving the aperture ratio.

As an example, specifically, as shown in FIG. 7, according to different color sub-pixels where the white sub-pixels are located, the pixel group 100 may comprise the white sub-pixel 1010 corresponding to the first color sub-pixel 101, the white sub-pixel 1020 corresponding to the second color sub-pixels 102, the white sub-pixel 1030 corresponding to the third color sub-pixel 103 and the white sub-pixel 1040 corresponding to the fourth color sub-pixel.

It should be noted that the white sub-pixel in the embodiment of the present invention may comprise an organic light emitting material that may be provided on the anode of the white sub-pixel and a cathode of the white sub-pixel may be further provided on the organic light emitting material.

In the embodiment of the present invention, the white sub-pixel and the driving transistor (i.e., the second driving transistor 2) of the white sub-pixel are formed on the driving transistor (i.e., the first driving transistor 1) of the color sub-pixel, and through certain process settings, the thickness of the first driving transistor 1 (specifically including for example a gate, a gate insulating layer, a source/drain, a passivation layer and a planar layer of the first driving transistor 1 and the like) may be made to be equal to the thickness of the micro-cavity of the white sub-pixel, that is, during the white sub-pixel is working, the first driving transistor 1 may be used as its micro-cavity.

When the display substrate of the present invention emits light in the form of top emission, the white sub-pixel may use its micro-cavity structure to adjust a light outgoing path, and micro-cavity effects generated by the micro-cavity structure may improve light extracting rate of the corresponding structure, hence improve light emission efficiency and brightness of OLED, and further may implement WOLED display in combination with the white sub-pixel. In the embodiment of the present invention, a white sub-pixel and a driving transistor thereof are provided in the space on the thickness dimension of the color sub-pixel, which do not need to occupy extra space on the planar dimension of a display panel, so that the light emitting layer missing region in the color sub-pixel can be fully used.

In the embodiment of the present invention, the four color sub-pixels in each pixel group are arranged in a 2×2 matrix, the light-emitting layer missing region (the region where the white sub-pixel, the first and second driving transistors are located) of each color sub-pixel is located on one corner of the color sub-pixel, and the light emitting layer missing regions of different color sub-pixels in the same pixel group are located on corners in different directions of the different color sub-pixels respectively.

As an example, as shown in FIG. 7, the pixel group comprises: a first color sub-pixel 101 in the upper left, wherein a light emitting layer missing region of the first color sub-pixel 101 is in the upper left of the first sub-pixel 101; a second color sub-pixel 102 in the upper right, wherein a light emitting layer missing region of the second color sub-pixels 102 is in the upper right of the second sub-pixel 102; a third color sub-pixel 103 in the lower left, wherein a light-emitting layer missing region of the third color sub-pixel 103 is in the lower right of the third sub-pixel 103; a fourth color sub-pixel 104 in the lower right, wherein a light-emitting layer missing region of the fourth color sub-pixel 104 is in the lower left of the fourth sub-pixel 104.

In one embodiment of the present invention, the first color sub-pixel 101, the second color sub-pixel 102, the third color sub-pixels 103, the fourth color sub-pixel 104 and the white sub-pixels 1010,1020,1030,1040 may be driven by a pixel rendering method.

It should be noted that, when setting the position of the light-emitting layer missing region in each color sub-pixel, if the light-emitting layer missing region of each sub-pixel faces toward the same direction, white sub-pixel of each sub-pixel is also disposed in the same direction. In this case, while each sub-pixel is driven by the sub-pixel rendering method, since the displayed sub-pixel borrows adjacent sub-pixels and white sub-pixels in the adjacent sub-pixels all face toward the same direction, white sub-pixels in the borrowed sub-pixels in peripheral will be located on the edge of the entire image, easily enabling the observer to observe the white boundary.

And if the light-emitting layer missing region of each sub-pixel faces toward the center, then white sub-pixels of four color sub-pixels in a pixel group 100 are in the center of the pixel group 100, and when the entire pixel group 100 is displayed, a white region in the center of the pixel group 100 will be observed and are usually displayed as white spots.

According to the positions of the white sub-pixels in the embodiment of the present invention, the two situations abovementioned may be avoided during displaying so that the white sub-pixels may be distributed evenly in the entirely displayed image, whereby WOLED display can be implemented well when the sub-pixel is driven by the sub-pixel rendering method for display.

In one embodiment, for each pixel group, two color sub-pixels located on one diagonal of a 2×2 matrix of the pixel group may be provided as green sub-pixels, and two color sub-pixels located on the other diagonal of a 2×2 matrix of the pixel group are provided as blue sub-pixel and red sub-pixel respectively.

As an example, the first color sub-pixel 101 and the fourth color sub-pixel 104 are green color sub-pixels, while one of the second color sub-pixel 102 and the third color sub-pixel 103 is a blue sub-pixel and the other is a red sub-pixel.

Alternatively, the second color sub-pixel 102 and the third color sub-pixel 103 are green color sub-pixels, while one of the first color sub-pixel 101 and the fourth color sub-pixels 104 is a blue sub-pixel and the other is a red sub-pixel.

Setting the color of each color sub-pixel according to the present embodiment may ensure each row and each column of the pixel group 100 contains one green sub-pixel, and further comprises one red sub-pixel or blue sub-pixel, so that when sub-pixels are driven using the sub-pixel rendering method, and the pixel group for displaying borrows adjacent sub-pixels, the pixel composed of the borrowed sub-pixels and the sub-pixels in the pixel group has the same proportion regarding the red, green, and blue sub-pixels of the pixel, thus achieving good sub-pixel rendering display effects.

Figure 9:
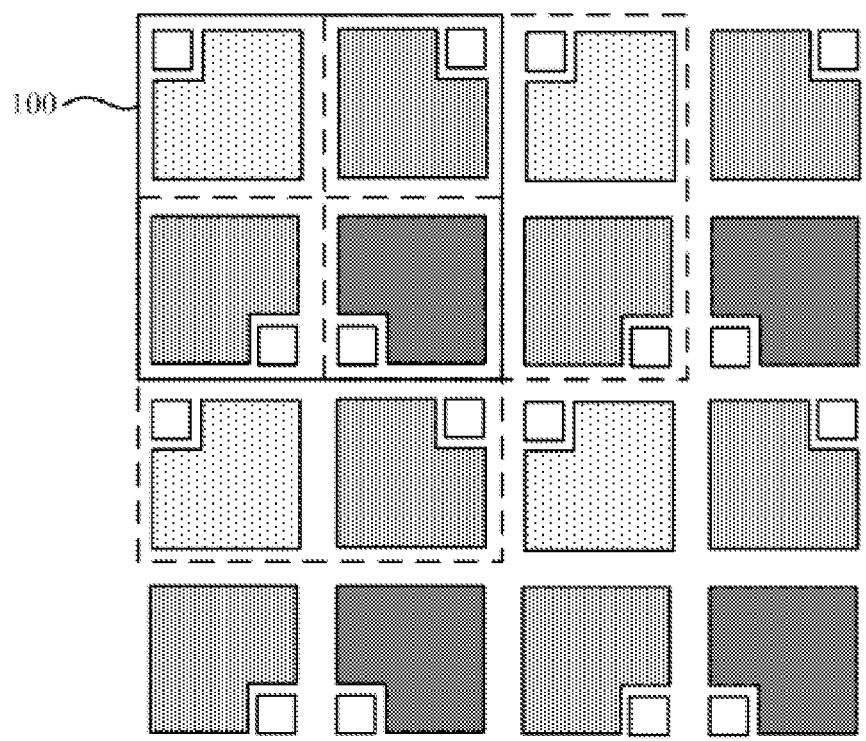
FIG. 9 shows a schematic diagram of a pixel arrangement according to one embodiment of the present invention.

In a specific embodiment, as shown in FIG. 9, the first color sub-pixel 101 of the pixel group 100 is a blue sub-pixel, the second color sub-pixel 102 is a green sub-pixel, the third color sub-pixel 103 is a green sub-pixel, and the fourth color sub-pixel 104 is a red sub-pixel. When lighting the pixel group in the upper left of four pixels (in order to show the color of each sub-pixel in the figure, the unlit sub-pixels are also indicated with color, but actually only sub-pixels in the lit pixel group and the borrowed sub-pixel appear colors), and when borrowing sub-pixels of an adjacent pixel group, for example, borrowing the sub-pixel in the first row of the third column on the right side that is a blue sub-pixel and the sub-pixel in the second row that is a green sub-pixel, the two sub-pixels and the second color sub-pixel 102 and fourth color sub-pixel 104 in the pixel group 100 form a new pixel group (as indicated by dashed lines in the right block), which still remains the composition ratio with two green sub-pixels, one red sub-pixel and one blue sub-pixel. Similarly, when borrowing the sub-pixels in the first and second columns of the third row downward, a new pixel group (as indicated by dashed lines in the lower block) formed by the borrowed sub-pixels and the third sub-pixel 103 and the fourth sub-pixel 104 in the pixel group 100 also remains the compositional ratio with two green sub-pixels, one red sub-pixel and one blue sub-pixel.

Figure 10:
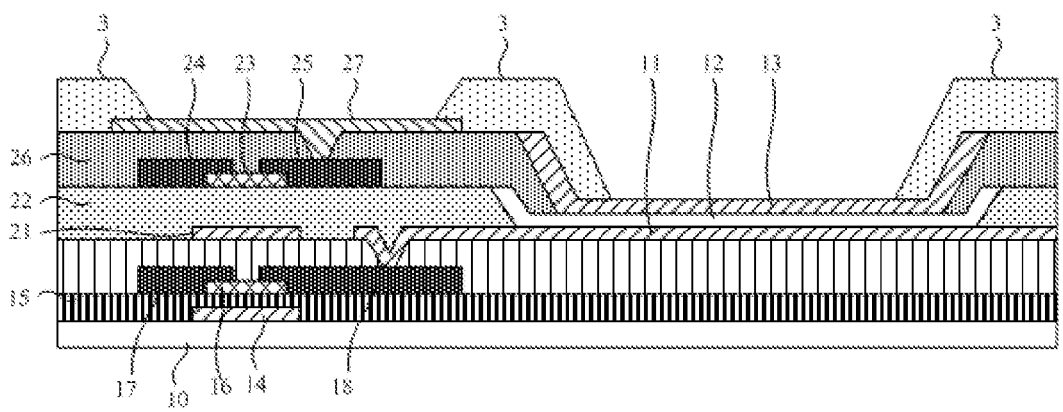
FIG. 10 shows a schematic diagram of a partial cross-sectional view of a specific structure of a display substrate according to one embodiment of the present invention.

As shown in FIG. 10, the display substrate provided according to the embodiment of the present invention may also comprise a planar layer provided on the first driving transistor 1, and the sum of the thickness of the first driving transistor 1 and the thickness of the planar layer is equal to the thickness of the micro-cavity of the white sub-pixel so that the first driving transistor and the planar layer may be used together as the micro-cavity of the white sub-pixel when the white sub-pixel is working.

In one embodiment of the present invention, as shown in FIG. 10, the second driving transistor 2 comprises:

a gate 21 provided on the planar layer; a gate insulating layer 22 provided on the gate 21; an active layer 23 provided on the gate insulating layer 22; a source 24 and a drain 25 provided on the active layer 23.

It needs to be noted that the planar layer may provide a planar condition for the gate 21 of the second driving transistor 2, of course, according to needs, the gate electrode 21 may also be formed directly on a passivation layer of the first transistor, eliminating the process to form the planar layer.

It may be appreciated that, in the embodiment of the present invention, as shown in FIG. 10, the first driving transistor 1 may comprise: a first gate 14 provided on a substrate 10; a first gate insulating layer 15 provided on the first gate 14; a first active layer 16 provided on the first gate insulating layer 15; a first source 17 and a first drain 18 provided on the first active layer 16. In addition, intermediate layers like a passivation layer and a planar layer may also be provided between the source and drain of the first driving transistor 1 and the gate 21 of the second driving transistor 2.

In one embodiment, a passivation layer 26 is further provided on the source 24 and on the drain 25, and an anode 27 of the white sub-pixel is provided on the passivation layer 26, wherein the anode 27 of the white sub-pixel is electrically connected through a via hole in the passivation layer 26 to the drain 25, and a pixel defining layer 3 is provided on the anode 27 of the white sub-pixel.

In one embodiment, the display substrate further comprises an anode of the color sub-pixel provided in the light emitting region. Preferably, the gate 21 of the second driving transistor 2 and the anode 11 of the color sub-pixel in the light-emitting region are formed in the same layer. Specifically, the gate 21 of the second driving transistor 2 and the anode 11 of the color sub-pixel in the light-emitting region may be formed by depositing a metal layer on the planar layer located above the first driving transistor 1 and then patterning the metal layer. Forming the gate 21 of the second driving transistor 2 and the anode 11 of the color sub-pixel in the same process may reduce the number of processes, simplifying process flows.

The display substrate provided according to an embodiment of the present invention further comprises: a color organic light emitting layer 12 provided on the anode 11 of the color sub-pixel of the light-emitting region; and a cathode 13 of the color sub-pixel provided on the color organic light emitting layer 12. The anode 11 of the color sub-pixel and the cathode 13 of the color sub-pixel work together to drive the color organic light emitting layer 12 to emit red, green and/or blue light.

In one embodiment, the cathode 13 of the color sub-pixel and the anode 27 of the white sub-pixel are formed in the same layer. Forming the anode 27 of the white sub-pixel and the cathode 13 of the color sub-pixel in the same process may reduce the number of processes, simplifying process flows.

In an embodiment of the present invention, there is also provided a display device, comprising any one of the foregoing display substrates.

It should be noted that the display device in the present embodiment may be an electronic paper, a mobile phone, a tablet computer, a television, a notebook computer, a digital picture frame, a navigator and any product or component with a display function.

According to another embodiment of the present invention, there is also provided a fabricating method of a display substrate. It should be noted that the fabricating method of the display substrate provided in the embodiment of the present invention may be used for fabricating any one display substrate provided in the various embodiments abovementioned, whereby the explanation and description for the display substrate abovementioned are also applicable to the fabricating method of the display substrate provided in the embodiment of the present invention.

Figure 11:
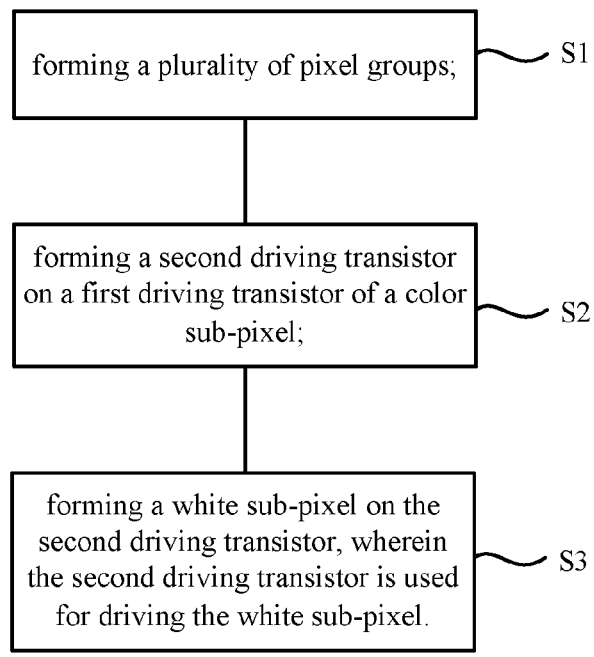
FIG. 11 shows a schematic flowchart of a fabricating method of a display substrate according to one embodiment of the present invention.

As shown in FIG. 11, the display substrate fabricating method comprises:

S1: forming a plurality of pixel groups 100, wherein each of said pixel groups comprises a plurality of color sub-pixels and a plurality of white sub-pixels, each color sub-pixel corresponding to one white sub-pixel, and each color sub-pixel comprises a light emitting region and a light emitting layer missing region, and a first driving transistor is provided in light emitting layer missing region, for driving the color sub-pixel, S2: forming a second driving transistor 2 on the first driving transistor 1 of the color sub-pixel;

S3: forming a white sub-pixel on the second driving transistor 2, wherein the second driving transistor 2 is used for driving the white sub-pixel.

In one embodiment, the thickness of the first driving transistor 1 is equal to the thickness of the micro-cavity of the white sub-pixel.

In one embodiment, each of the pixel groups comprises four color sub-pixels and four white sub-pixels, and the forming each color sub-pixel in the pixel group 100 comprises: forming the four color sub-pixels in each pixel group in a 2×2 matrix arrangement; forming the light-emitting layer missing region of each of the color sub-pixels on one corner of the color sub-pixel, wherein the light emitting layer missing regions of different color sub-pixels in the same pixel group are located on corners in different directions of the different color sub-pixels.

As an example, the first color sub-pixel 101 may be formed in the upper left of the pixel group 100, the second color sub-pixel 102 may be formed in the upper right of the pixel group 100, the third color sub-pixel 103 may be formed in the lower left of the pixel group 100, and the fourth color sub-pixel 104 may be formed in the lower right of the pixel group 100. Accordingly, the light emitting layer missing region of the first color sub-pixel 101 may be located in the upper left of the first sub-pixel 101, the light emitting layer missing region of the second color sub-pixels 102 may be located in the upper right of the second sub-pixel 102, the light-emitting layer missing region of the third color sub-pixel 103 may be located in the lower right of the third sub-pixel 103 and the light-emitting layer missing region of the fourth color sub-pixel 104 may be located in the lower left of the fourth sub-pixel 104.

In one embodiment, before the forming the second driving transistor 2, the method further comprises: forming a planar layer on the first driving transistor 1, the sum of the thickness of the first driving transistor and the thickness of the planar layer being equal to the thickness of the micro-cavity of the white sub-pixel.

Figure 12:
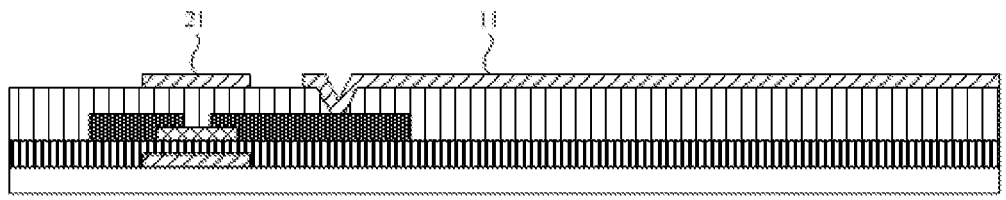
FIGS. 12 to 18 show specific schematic diagrams of forming a second driving transistor and the corresponding structure thereof according to one embodiment of the present invention.
Figure 13:
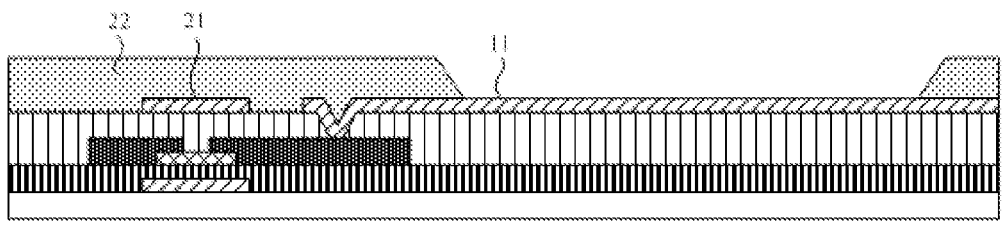
Figure 14:
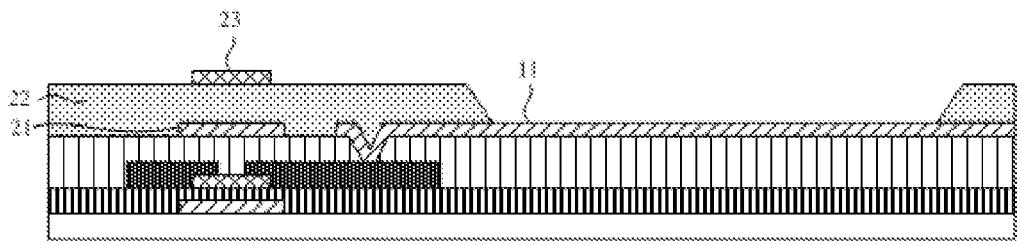
Figure 15:
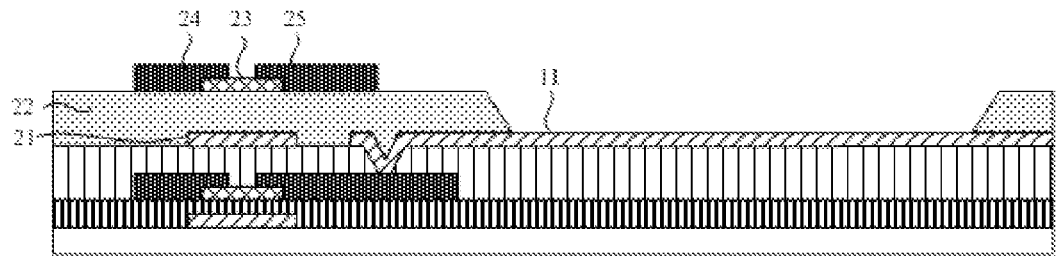

In one embodiment, the forming the second driving transistor 2 comprises: forming a gate 21 on the planar layer of the first driving transistor 1, as shown in FIG. 12; forming a gate insulating layer 22 on the gate 21, as shown in FIG. 13; forming an active layer 23 on the gate insulating layer 22, as shown in FIG. 14; forming a source 24 and a drain 25 on the active layer 23, as shown in FIG. 15.

Figure 17:
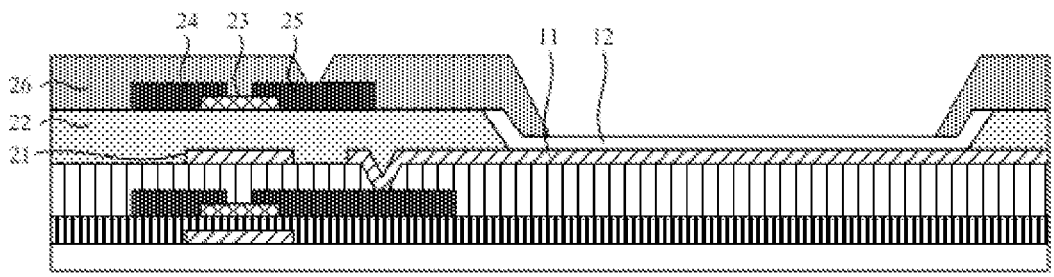
Figure 18:
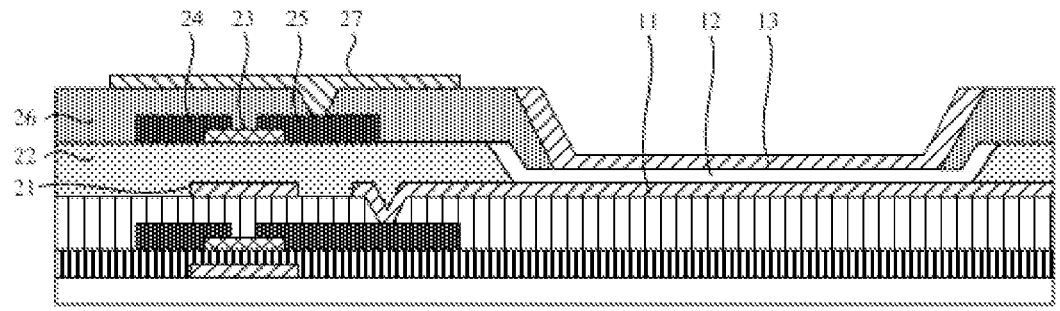

In one embodiment, the fabricating method of the display substrate further comprises: forming a passivation layer 26 on the source 24 and on the drain 25; forming a via hole in the passivation layer 26, as shown in FIG. 17; forming an anode 27 of the white sub-pixel on the passivation layer 26, such that the anode 27 of the white sub-pixel is electrically connected through the via hole to the drain 25, as shown in FIG. 18; forming a pixel defining layer 3 on the anode 27 of the white sub-pixel, and finally obtaining the structure as shown in FIG. 10.

In one embodiment, the fabricating method of the display substrate further comprises forming an anode of the color sub-pixel in the light emitting region, and optionally the anode 11 of the color sub-pixel is formed in the light emitting region when the gate 21 of the second driving transistor 2 is formed, as shown in FIG. 12.

Figure 16:
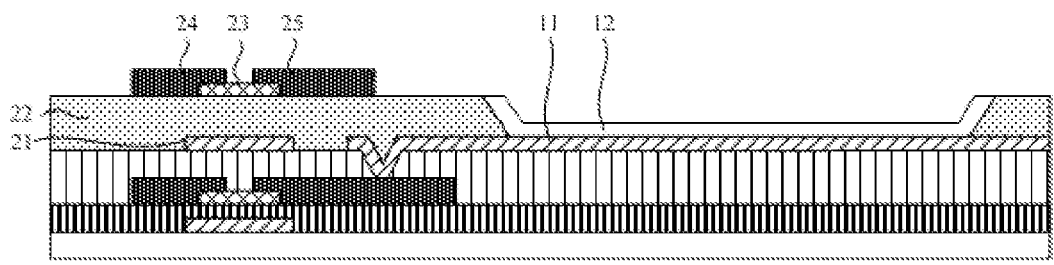

In one embodiment, the fabricating method of the display substrate further comprises: forming a color organic light emitting layer 12 (as shown in FIG. 16) on the anode 11 of the color sub-pixel; forming a cathode 13 of the color sub-pixel on the color organic light emitting layer 12. It should be noted that, the color organic light emitting layer 12 may be formed after the gate insulating layer 22 is formed, may be formed after the active layer 23 is formed, and also may be formed after the source 24 and drain 25 are formed.

In one embodiment, the cathode 13 of the color sub-pixel is formed when the anode 27 of the white sub-pixel is formed, as shown in FIG. 18.

Wherein the formation processes employed in the above-described flow may comprise, for example, film formation processes like deposition and sputtering, as well as patterning processes like etching.

The technical solution of the present invention has been described in detail above in combination with the drawings. Considering that the light emitting layer missing region in the pixel of the display substrate in the prior art certainly loses an aperture area, the present invention may implement WOLED display by forming the white sub-pixel and the driving transistor (i.e., the second driving transistor) of the white sub-pixel on the driving transistor (i.e., the first driving transistor) of the color sub-pixel, while making full use of the space on the thickness dimension of the color sub-pixel, without occupying the space on the planar dimension of the display panel, whereby the light emitting layer missing region in the color sub-pixel is fully utilized and hence the aperture ratio may be increased.

It should be noted that, in the drawings, for the sake of clarity, the sizes of layers and regions may be exaggerated. And it may be appreciated that when an element or layer is referred to as being "on" another element or layer, it can be directly on the other element, or there may exist an intermediate layer. Further, it may be appreciated that when an element or layer is referred to as being "below" another element or layer, it can be directly below the other element, or there may exist one or more intermediate layers or elements. In addition, it also may be appreciated that when a layer or element is referred to as being "between" two layers or elements, it can be the unique layer between the two layers or elements, or there also may exist one or more intermediate layers or elements. Throughout similar reference signs indicate similar elements.

In the present invention, the term "first", "second", or "third" is merely for descriptive purposes, and cannot be construed as indicating or implying relative importance. The term "a plurality of" refers to two or more, unless otherwise expressly defined.

The foregoing is only preferred embodiments of the present invention but is not to limit the present invention. To those skilled in the art, the present invention may have various modifications and variations. Any modification, equivalent substitution, or improvement made within the spirit and principles of the present invention, should be comprised within the scope of protection of the present invention.

What is claimed is:

1. A display substrate comprising:
a plurality of pixel groups, wherein:
each of said pixel groups comprises four color sub-pixels and four white sub-pixels, and each color sub-pixel corresponds to one white sub-pixel;
each color sub-pixel comprises a light emitting region and a light emitting layer missing region, a first driving transistor is positioned in the light emitting layer missing region for driving the color sub-pixel, a second driving transistor and the white sub-pixel corresponding to the color sub-pixel are positioned on the first driving transistor, and the second driving transistor is configured to drive the white sub-pixel; and the four color sub-pixels in each pixel group are arranged in a 2×2 matrix, the light emitting layer missing region of each color sub-pixel is located on one corner of the color sub-pixel along an outer edge of the pixel group, and the light emitting layer missing regions of different color sub-pixels in the same pixel group are located on different respective corners of their color sub-pixels.

2. The display substrate according to claim 1, wherein each first driving transistor defines a micro-cavity for its corresponding white sub-pixel.

3. The display substrate according to claim 1, wherein the color sub-pixels and the white sub-pixels are arranged to be driven by a sub-pixel rendering method.

4. The display substrate according to claim 3, wherein in each of the pixel groups, two color sub-pixels located on one diagonal of the 2×2 matrix are green sub-pixels, and two color sub-pixels located on the other diagonal are a blue sub-pixel and a red sub-pixel respectively.

5. The display substrate according to claim 1, further comprising:
a planar layer positioned on at least one of the first driving transistors, wherein the first driving transistor and the planar layer define a micro-cavity for their corresponding white sub-pixel.

6. The display substrate according to claim 5, wherein one of the second driving transistors comprises:
a gate positioned on the planar layer;
a gate insulating layer positioned on the gate;
an active layer positioned on the gate insulating layer; and
a source and a drain positioned on the active layer.

7. The display substrate according to claim 6, wherein a passivation layer is further positioned on the source and on the drain, an anode of the corresponding white sub-pixel is positioned on the passivation layer, the anode of the white sub-pixel is electrically connected to the drain through a via hole in the passivation layer, and a pixel defining layer is positioned on the anode of the white sub-pixel.

8. The display substrate according to claim 7, further comprising an anode of the corresponding color sub-pixel positioned in the light emitting region, wherein the gate of the second driving transistor and the anode of the color sub-pixel are positioned in the same layer.

9. The display substrate according to claim 8, further comprising:
a color organic light emitting layer positioned on the anode of the color sub-pixel of the light-emitting region; and
a cathode of the color sub-pixel positioned on the color organic light emitting layer.

10. The display substrate according to claim 9, wherein the cathode of the color sub-pixel and the anode of the white sub-pixel are positioned in the same layer.

11. A display device comprising the display substrate according to claim 1.

12. A method of fabricating a display substrate, the method comprising:
forming a plurality of pixel groups, wherein each of said pixel groups comprises four color sub-pixels and four white sub-pixels, each color sub-pixel corresponds to one white sub-pixel, and each color sub-pixel comprises a light emitting region, a light emitting layer missing region and a first driving transistor positioned in the light emitting layer missing region to drive the color sub-pixel;
forming a second driving transistor on the first driving transistor of one of the color sub-pixels; and
forming the white sub-pixel corresponding to the color sub-pixel on the second driving transistor, wherein the second driving transistor is configured to drive the white sub-pixel;
wherein the four color sub-pixels in each pixel group are arranged in a 2×2 matrix arrangement, the light emitting layer missing region of each of the color sub-pixels is positioned on one corner of said color sub-pixel along an outer edge of the pixel group, and the light emitting layer missing regions of different color sub-pixels in the same pixel group are located on different respective corners of their color sub-pixels.

13. The method of fabricating the display substrate according to claim 12, wherein before forming the second driving transistor, the method further comprises:
forming a planar layer on at least one of the first driving transistors, wherein the first driving transistor and the planar layer define a micro-cavity for their corresponding white sub-pixel;
wherein forming the second driving transistor comprises:
forming a gate on the planar layer;
forming a gate insulating layer on the gate;
forming an active layer on the gate insulating layer;
forming a source and a drain on the active layer; and
wherein, after forming the second driving transistor, the method further comprises:
forming a passivation layer on the source and on the drain;
forming a via hole in the passivation layer;
forming an anode of the white sub-pixel on the passivation layer, such that the anode of the white sub-pixel is electrically connected to the drain through the via hole; and
forming a pixel defining layer on the anode of the white sub-pixel.

14. The method of fabricating the display substrate according to claim 13, further comprising forming an anode of the color sub-pixel in the light emitting region of the color sub-pixel, wherein the anode of the color sub-pixel is formed when the gate of the second driving transistor is formed.

15. The method of fabricating the display substrate according to claim 14, further comprising:
forming a color organic light emitting layer on the anode of the color sub-pixel; and
forming a cathode of the color sub-pixel on the color organic light emitting layer, wherein the cathode of the color sub-pixel is formed when the anode of the white sub-pixel is formed.

16. The display device according to claim 11, wherein each first driving transistor defines a micro-cavity for its corresponding white sub-pixel.

\* \* \* \* \*